(12) United States Patent
Lim et al.

(10) Patent No.: US 6,846,359 B2
(45) Date of Patent: Jan. 25, 2005

(54) EPITAXIAL COSI$_2$ ON MOS DEVICES

(75) Inventors: Chong Wee Lim, Urbana, IL (US); Chan Soo Shin, Daejeon (KR); Ivan Georgiev Petrov, Champaign, IL (US); Joseph E. Greene, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 89 days.

(21) Appl. No.: 10/280,668

(22) Filed: Oct. 25, 2002

(65) Prior Publication Data

US 2004/0079279 A1 Apr. 29, 2004

(51) Int. Cl.$^7$ .............................................. G30B 25/04
(52) U.S. Cl. ......................... 117/86; 438/682; 438/683
(58) Field of Search ........................... 117/86; 438/682, 438/683

(56) References Cited

U.S. PATENT DOCUMENTS

| | | | | |
|---|---|---|---|---|
| 5,780,929 A | | 7/1998 | Zeininger et al. ............ | 257/751 |
| 6,136,699 A | * | 10/2000 | Inoue ........................... | 438/656 |
| 6,136,999 A | * | 10/2000 | Chander et al. .............. | 560/21 |
| 6,228,727 B1 | | 5/2001 | Lim et al. .................... | 438/296 |
| 6,265,302 B1 | | 7/2001 | Lim et al. .................... | 438/622 |
| 6,271,133 B1 | | 8/2001 | Lim et al. .................... | 438/683 |
| 6,303,503 B1 | | 10/2001 | Kamal et al. ................ | 438/682 |

OTHER PUBLICATIONS

S.–L. Zhang, J. Cardenas, F.M. d' Heurle, B.G. Svensson, and C.S. Petersson, " On the formation of epitaxial CoSi$_2$ from the reaction of Si with a Co/Ti bilayer", Appl. Phys. Lett. 66 (1), Jan. 2, 1995, pp. 58–60.

M. Falke, B. Gebhardt, G. Beddies, S. Teichert, H.J. Hinneberg, Epitaxial CoSi$_2$ by solid phase reaction of Co/Ti and Co/Hf bilayers on Si (001), Microelectronic Engineering 55 (2001), pp. 171–175.

Hwa Sung Rhee, Byung Tae Ahn, and Dong Kyun Sohn, " Growth behavior and thermal stability of epitaxial CoSi$_2$ layer from cobalt–carbon films on (100) Si substrate", Journal of Applied Physics, vol. 86, No. 6, Sep. 15, 1999, pp. 3452–3459.

C. Detavemier, R.L. Van Meirhaeghe, F. Cardon, R.A. Donaton, and K. Maex, " CoSi$_2$ formation in the presence of interfacial silicon oxide", Applied Physics Letters, vol. 74, No. 20, May 17, 1999, pp. 2930–2932.

* cited by examiner

*Primary Examiner*—Felisa Hiteshew
(74) *Attorney, Agent, or Firm*—Greer, Burns & Crain, Ltd.

(57) ABSTRACT

An Si$_x$N$_y$ or SiO$_x$N$_y$ liner is formed on a MOS device. Cobalt is then deposited and reacts to form an epitaxial CoSi$_2$ layer underneath the liner. The CoSi$_2$ layer may be formed through a solid phase epitaxy or reactive deposition epitaxy salicide process. In addition to high quality epitaxial CoSi$_2$ layers, the liner formed during the invention can protect device portions during etching processes used to form device contacts. The liner can act as an etch stop layer to prevent excessive removal of the shallow trench isolation, and protect against excessive loss of the CoSi$_2$ layer.

18 Claims, 4 Drawing Sheets

EPITAXIAL COSI₂ ON MOS DEVICES

STATEMENT OF GOVERNMENT INTEREST

This invention was made with United States Government assistance through the U.S. Department of Energy, Grant No. DEFG02-ER-45439. The Government has certain rights in this invention.

FIELD OF INVENTION

The field of the invention is semiconductor MOS devices. The invention particularly concerns deep sub-micron devices.

BACKGROUND

Cobalt silicide ($CoSi_2$) has been widely utilized in MOS devices for electrical contacts and interconnect material. $CoSi_2$ reduces device parasitic electrical resistance, and therefore enhances drive-current and performance of the devices. As device scaling extends into the deep sub-micron regime, shallow source/drain junctions are important to prevent junction "punch-through" and reduce the effect of drain-induced barrier lowering (DIBL).

One method for fabricating a $CoSi_2$ layer involves using polycrystalline $CoSi_2$ film through conventional solid phase epitaxial growth. One problem associated with this technique is that the resultant non-uniform silicide-silicon interface could cause abnormal junction leakage current, especially in deep sub-micron devices equipped with shallow junctions. Specifically, the non-uniform interface between polycrystalline $CoSi_2$ and Si creates localized weak-spots. The localized weak spots can form the origin of junction leakage. Current leakage can be especially severe if the depth of the junction is shallow, e.g., as in deep sub-micron devices.

Oxide-mediated epitaxial growth and related techniques have been proposed to enhance the formation of epitaxial $CoSi_2$. These techniques make use of an oxide or titanium mediated layer to enhance the growth of epitaxial $CoSi_2$. In these processes, excessive loss of $CoSi_2$ during contact etching processes could result in high contact resistance and degrade the device performance and reliability.

Once a $CoSi_2$ layer has been formed, a common, known practice to form borderless and self-aligned contacts is to form an additional layer of low-temperature PECVD silicon nitride, which functions as the etch-stop layer during contact etching. This layer preserves the junction and contact integrity by inhibiting both shallow-trench-isolation (STI) oxide gouging and excessive loss of silicide during contact-etching. A drawback associated with any additional layer, though, is the addition of a step in the device manufacturing process, which increases manufacturing costs. There is also a likelihood of device damage as a result of PID (plasma induced damage) damage during the PECVD deposition process. Also, the presence of the additional layer of silicon nitride reduces the spacing between the adjacent polysilicon electrodes, and therefore poses difficulty for subsequent inter-layer-dielectric (ILD) formation.

SUMMARY OF THE INVENTION

The present invention is directed to the formation of epitaxial $CoSi_2$ layers on silicon MOS devices. In the invention, an $Si_xN_y$ or $SiO_xN_y$ liner is formed on the MOS device. Cobalt is then deposited and reacts to form epitaxial $CoSi_2$ layers underneath the liner. The cobalt silicide may be formed through a solid phase epitaxy or reactive deposition epitaxy salicide process. The liner can act as an etch stop layer.

DETAILED DESCRIPTION OF THE INVENTION

Figure 1:
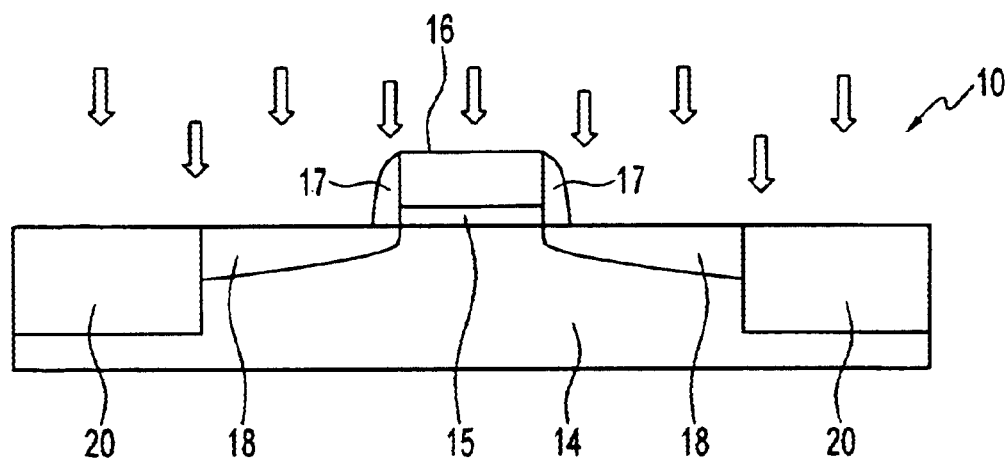
FIGS. 1–3 are schematic sectional views illustrating the steps for forming a liner and $CoSi_2$ layer on a MOS device in accordance with one embodiment of the present invention.

The inventors concluded that a method to form high quality epitaxial $CoSi_2$ was needed. The invention generally concerns novel methods for formation of epitaxial $CoSi_2$ layers on MOS devices. Methods of the invention may be used to accomplish the formation of borderless and self-aligned contacts. Borderless contacts are defined as contacts with zero or negative overlay at the border of active source/drain junctions and field-edge isolations. Self-aligned contacts are defined as contacts that are formed between two neighboring polysilicon gate electrodes, and with zero or negative overlay at the border of active source/drain junctions and spacer-isolation. Methods of the invention prevent excessive shallow trench isolation oxide gouging and silicide loss during the formation of borderless and self-aligned contacts. The use of borderless and self-aligned contacts with the invention offers the advantage of further reduction in the device's dimension. The invention will now be illustrated with respect to preferred processes for formation of a MOS FET.

Turning now to FIGS. 1–4, a FET 10 may form a portion of a larger MOS device and is shown in various stages illustrating a $CoSi_2$ fabrication process in accordance with an embodiment of the present invention. The FET 10 includes a Si substrate 14, a gate oxide layer 15 separating a gate 16 from the substrate 14, oxide spacers 17 and source/drain junctions 18 formed in the Si substrate 14. Also provided in the substrate 14 adjacent the source/drain junctions 18 are shallow trench isolations (STI) 20 which provide electrical isolation for the FET 10 from neighboring devices (not shown).

Referring to FIG. 1, the preferred method begins with annealing in nitrogen-containing gas or $N_2$-based plasma using any of known thermal or plasma-enhanced (PE) nitridation processes such as, for example, remote-plasma method, high-density plasma (HDP), inductive-couple plasma (ICP), microwave plasma, electron cyclotron resonance plasma (ECR), and RF or DC magnetron induced plasma. In particularly preferred embodiments, the DC magnetron induced plasma process is used. During this process, the surface of the MOS device is heated, e.g., to a temperature of 850° C., to enhance interaction of the nitrogen plasma with the MOS surface.

Figure 2:
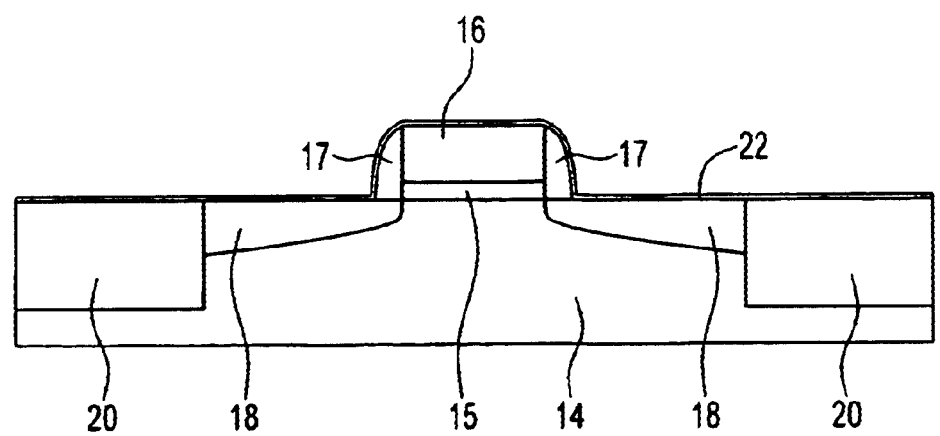

The preferred plasma-nitridation process is conducted under conditions and for a time sufficient to form a thin layer of liner 22, as shown in FIG. 2. The liner 22 can be either $Si_xN_y$ or $SiO_xN_y$ (If x=1, then y may range from 0.01–1.33), depending on the substrate and the gas mixture used for generating the plasma. In the preferred embodiment, the liner 22 is approximately 15 Å, but can range from about 5

Å to 300 Å. The nitrogen mixture gas source for plasma nitridation can be, for example, any of $N_2/O_2/Ar$, $N_2/Ar$, $NH_3/Ar$, or $N_2/Ar$.

Figure 3:
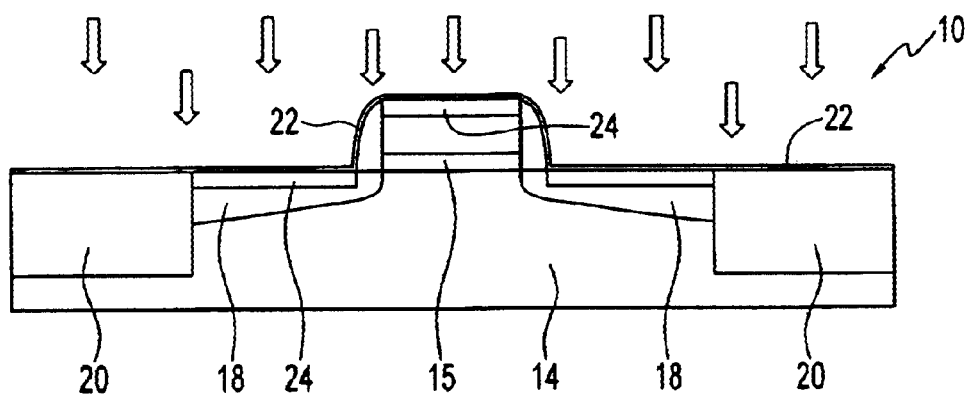

Turning to FIG. 3, and employing either a solid phase epitaxy (SPE) or reactive deposition epitaxy (RDE) salicide process, a Co deposition is conducted subsequent to formation of the liner 22. From 10 Å to 1000 Å of $CoSi_2$ are formed. With solid phase epitaxy, the deposition of Co is followed by a post-annealing, e.g., to a temperature of approximately 700° C., to diffuse the Co through the liner 22 and enhance the interaction between Co and Si substrate 14 and form an epitaxial $CoSi_2$ layer 24 underneath the liner 22. In the preferred embodiment, the thickness of the epitaxial $CoSi_2$ layer 24 is approximately 300 Å. However, the thickness can be anywhere from about 10 Å to 1000 Å.

By providing the liner 22 on the surface of the FET 10 prior to the salicide process, the epitaxial $CoSi_2$ layer 24 is formed with a smooth silicide/silicon ($CoSi_2$/Si) interface, thereby minimizing junction leakage. The liner 22 is displaced during the formation of the $CoSi_2$ layer 24 but remains intact and acts as a protective layer for the $CoSi_2$ layer. A contact may then be formed upon the liner 22. The methods for forming the contact may vary. A typical preferred process assumed to be part of a process for forming a circuit interconnect pattern in a multiple device integration will now be discussed.

Figure 6:
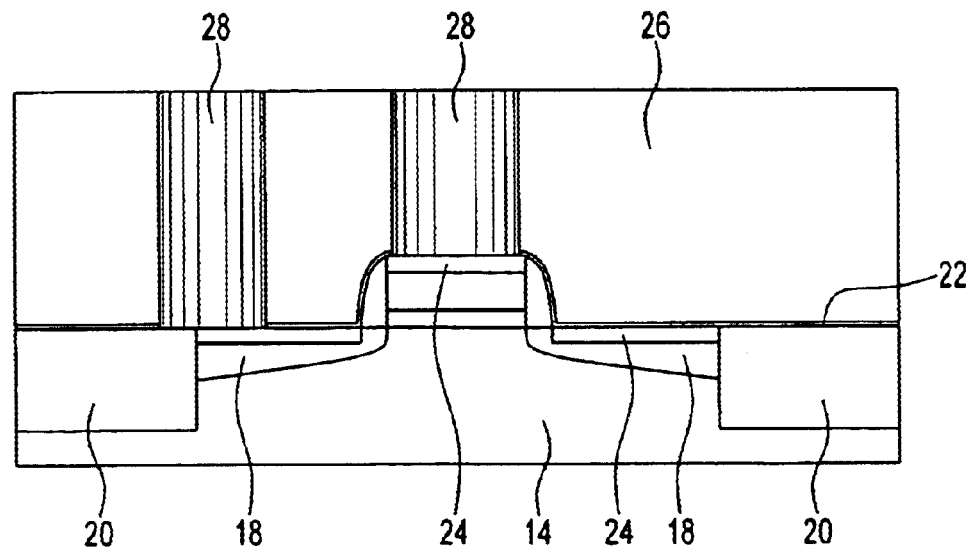
FIGS. 4–6 are schematic sectional views illustrating the steps for forming borderless and self-aligned electrical contacts on electrically active portions of the MOS device of FIGS. 1–3; and, FIG. 7 is a schematic sectional view illustrating a manner in which excessive "over-etching" in the formation of electrical contacts on a MOS device is prevented in accordance with one embodiment of the present invention.
Figure 4:
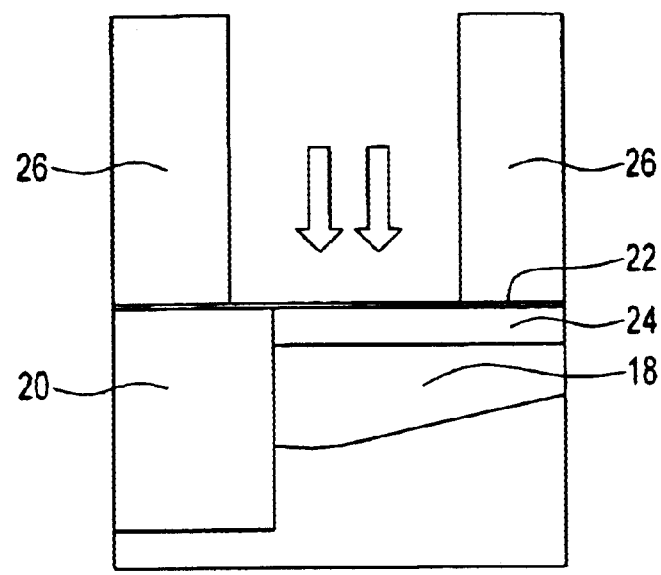
Figure 5:
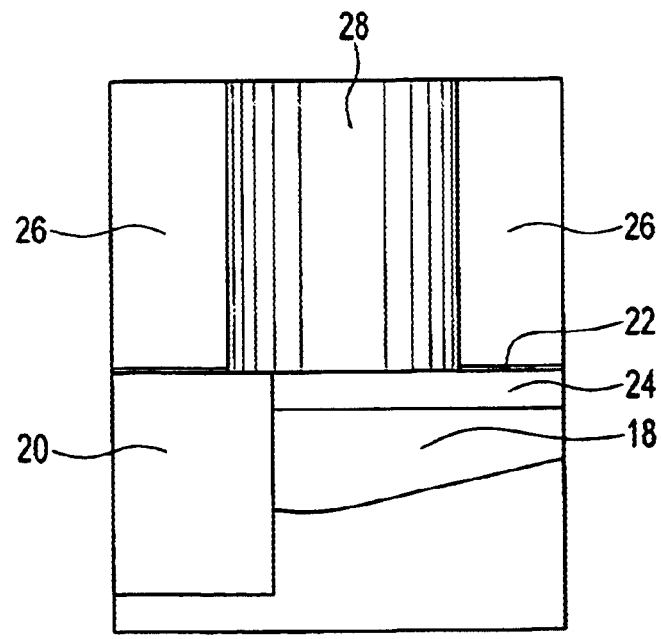

Turning now to FIGS. 4–6, after the epitaxial $CoSi_2$ layer 24 has been formed, the entire surface of the FET 10 is covered with an interlevel dielectric (ILD) layer 26. Then, an etching process is performed to selectively remove the ILD layer at the source/drain junction 18 region and the gate 16. Liner 22 protects the underneath $CoSi_2$ layer 24 and STI oxide 20 during the removal of ILD layer 26, as illustrated in FIG. 4. Subsequently, etching is performed until the liner 22 is removed to the extent necessary to reach the $CoSi_2$ layer 24, but short of gouging into the STI 20 and $CoSi_2$ layer 24 (best shown in FIG. 5). Electrical contacts 28, preferably either borderless contacts (BC) or self-aligned contacts (SAC), are formed in the area opened by the etching processes (best shown in FIGS. 5 and 6) through the deposition of a metallic layer or other suitable conductive material. Multilayer and multimaterial contacts may be formed. Any conventional contact formation process may be used. The liner 22 functions as an etch stop layer to prevent gouging of the STI 20 during the ILD etching process, thereby preserving field-edge junction integrity and minimizing junction leakage current. FIG. 6 shows the structure after contacts 28 have been formed.

Figure 7:
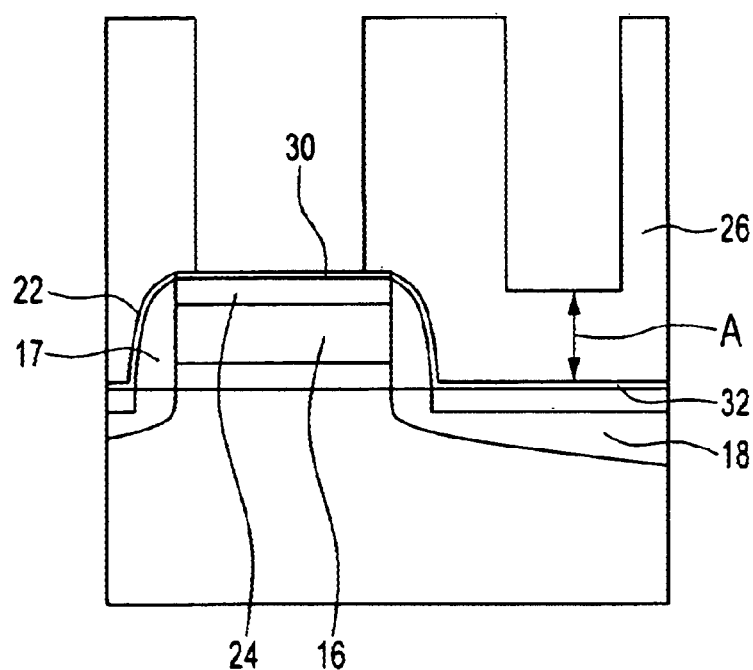

Turning now to FIG. 7, a certain amount of "over-etching" is necessary when forming electrical contacts 28 on the example FET 10 due to its topology. There exists a height difference of "A" between a surface 30 of the gate 16 and a surface 32 of the source/drain junction 18. As a result, the ILD layer 26 over the surface 30 of the gate 16 is removed prior to the removal of the ILD layer over the source/drain junction 18 region during a plasma etching process. The presence of liner 22 prevents the epitaxial $CoSi_2$ layer 24 formed on the gate 16 from being excessively over-etched while the ILD layer is being etched over the source/drain junction 18 region. Thus, the liner 22 acts as an etch stop layer.

From the foregoing description, it should be understood that an improved method for forming an epitaxial $CoSi_2$ layer on a MOS has been shown and described which has many desirable attributes and advantages. A liner is utilized in this invention to enhance formation of the epitaxial $CoSi_2$ layer. The liner also assists in reducing junction leakage during contact formation by preventing excessive removal of the STI, and protects against excessive loss of the $CoSi_2$ layer.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for forming an epitaxial $CoSi_2$ layer on a MOS device having a Si substrate, said method comprising the steps of:

forming an $Si_xN_y$ or $SiO_xN_y$ liner on the MOS device; and depositing Co through a solid phase epitaxy or a reactive deposition epitaxy salicide process to form an epitaxial $CoSi_2$ layer underneath the liner on Si portions of the device.

2. The method as defined in claim 1 wherein said step of depositing comprises solid phase epitaxy and the method further comprises a step of post-annealing to enhance interaction between Si and Co.

3. The method as defined in claim 2 wherein said step of post-annealing is conducted at approximately 700° C.

4. The method as defined in claim 1 wherein said step of forming comprises one of a thermal or plasma-enhanced nitridation process.

5. The method as defined in claim 1 wherein said step of forming forms an approximately 5 Å to 300 Å liner.

6. The method as defined in claim 5 wherein said step of forming forms an approximately 15 Å liner.

7. The method as defined in claim 5 wherein said step of depositing comprises forming approximately 10 Å to 1000 Å $CoSi_2$.

8. The method as defined in claim 7 wherein said step of depositing comprises forming approximately 300 Å $CoSi_2$.

9. The method as defined in claim 1 wherein x=1, and y ranges from 0.01–1.33.

10. A method for fabricating a MOS device having an epitaxial $CoSi_2$ silicide layer, the device including a Si substrate, a gate, source/drain junction regions formed in the Si substrate, and shallow trench isolations formed in the Si substrate, the method comprising the steps of:

forming an $Si_xN_y$ or $SiO_xN_y$ liner on the MOS device;

depositing Co to form an epitaxial $CoSi_2$ layer underneath the liner on Si portions of the device through a solid phase epitaxy or a reactive deposition epitaxy salicide process;

forming an interlevel dielectric layer;

etching to selectively remove the interlevel dielectric layer at the gate and the source/drain junction region;

etching to remove the liner from the gate and the source/drain junction regions; and forming electrical contacts to the $CoSi_2$ layer at the gate and the source/drain junction regions.

11. The method as defined in claim 10 wherein said step of depositing comprises solid phase epitaxy and the method further comprises a step of post-annealing to enhance interaction between Si and Co.

12. The method as defined in claim 11 wherein said step of post-annealing is conducted at approximately 700° C.

13. The method as defined in claim 12 wherein said step of depositing comprises one of a thermal or plasma-enhanced nitridation process.

14. The method as defined in claim 10 wherein said step of forming an $Si_xN_y$ or $SiO_xN_y$ liner forms an approximately 5 Å to 300 Å liner.

15. The method as defined in claim 14 wherein said step of forming an $Si_xN_y$ or $SiO_xN_y$ liner forms an approximately 15 Å liner.

16. The method as defined in claim 14 wherein said step of depositing comprises forming approximately 10 Å to 1000 Å $CoSi_2$.

17. The method as defined in claim 16 wherein said step of depositing comprises forming approximately 300 Å $CoSi_2$.

18. The method as defined in claim 10 wherein x=1, and y ranges from 0.01–1.33.

* * * * *